United States Patent [19]

Mikami et al.

[11] 4,410,234
[45] Oct. 18, 1983

[54] TIMING PULSE GENERATOR FOR SCANNING APPARATUS

[75] Inventors: Tomohisa Mikami, Kawasaki; Fumitaka Abe, Inagi; Fumio Sakurai; Tadashi Matsuda, both of Yokohama, all of Japan

[73] Assignee: Fumitsu Limited, Kanagawa, Japan

[21] Appl. No.: 138,110

[22] Filed: Apr. 7, 1980

[30] Foreign Application Priority Data

Apr. 10, 1979 [JP] Japan .................................. 54-43275

[51] Int. Cl.³ ............................................. G02B 27/17
[52] U.S. Cl. .................................... 350/6.8; 307/106; 350/332
[58] Field of Search .................. 350/6.8, 332; 307/106

[56] References Cited

U.S. PATENT DOCUMENTS 2,860,243 11/1958 Kaplan ................................ 307/106
3,054,958 9/1962 Bensky et al. ....................... 307/106
3,848,087 11/1974 Carrell ................................. 350/6.8
4,044,546 8/1977 Kolke ................................... 350/332

OTHER PUBLICATIONS

Blanchard, "Incremental Width Pulse Generating Circuit", Western Electric Technical Digest, No. 22, 4/71, pp. 5-6.

Primary Examiner—John K. Corbin
Assistant Examiner—Rebecca D. Gass
Attorney, Agent, or Firm—Staas & Halsey

[57] ABSTRACT

A timing pulse generator for producing timing pulses the period of which is variable. In the timing pulse generator, a plurality of reference pulse trains are produced which have the same frequency as each other, but different phases from each other. Then, each of the pulses comprising the final timing pulses to be produced is created by suitably selecting one of the pulses from among the reference pulse trains, sequentially.

19 Claims, 10 Drawing Figures

TIMING PULSE GENERATOR FOR SCANNING APPARATUS

BACKGROUND OF THE INVENTION

1. Field of the Invention

The present invention relates to a timing pulse generator and, more particularly, relates to a timing pulse generator which is suitable for controlling a non-impact printer.

Generally, a non-impact printer, such as a laser printer, comprises: a light source; a light modulator which receives a light beam from the light source and which produces a modulated light beam in accordance with both a character signal provided from a character generator and print timing control pulses; a light modulation controller which is comprised of a print timing control pulse generator and a character generator which generates a character signal which is synchronous with print timing control pulses, and; a light beam reflector made of a rotating polygonal mirror or galvanometer which alternately reflects the modulated light beam for scanning an area of a rotating photoconductor drum. A printing sheet is coupled with the photoconductor drum and an original character pattern is reproduced on the printing sheet by utilizing a well-known electrophotographic process.

However, the above described non-impact printer has an inherent problem in that the scanning light beam cannot scan the surface of the photoconductor drum at a constant scanning speed along each scanning line from one end to the other end. Specifically, the middle area of each scanning line is scanned at a relatively low scanning speed, while both side areas thereof are scanned at a relatively high scanning speed. This is because the scanning light beam is reflected from a point located on the polygonal mirror or galvanometer and is swung from one end to the other end of each scanning line (the details of this fact will be mentioned hereinafter). It should be noted that, when the character pattern is generated with constant scanning frequency, each scanning line should be scanned by the scanning light beam at a constant scanning speed and when the character pattern is printed with variable scanning speed, the frequency for generating the character pattern should be changed in proportional to the variable scanning speed, in order to reproduce the original character pattern without producing any distortion on the printing sheet.

2. Description of the Prior Art

In the prior art, for the purpose of solving the above mentioned problem, three typical methods have been proposed. According to a first method, a $f-\theta$ lens or a parabolic reflector is introduced in the light beam path between the polygonal mirror and the photoconductor drum, so that the scanning light beam can scan the scanning line on the drum, from one end to the other end, at a constant scanning speed.

In second and third methods, the scanning speed is variable and the character pattern is generated based on clock pulses having the frequency proportional to the variable scanning speed.

According to the second method, an analogue control device is employed in the printer. The analogue control device is mainly comprised of both a function generator and a voltage controlled oscillator (VCO). The output from the function generator is applied to the control input of the VCO. The VCO produces basic clock pulses from which the print timing control pulses are to be derived. The frequency of the basic clock pulses is variable so as to keep the ratio between the scanning speed and the frequency of the basic clock pulses constant. The variation of the frequency of the basic clock pulses is determined by the function generator.

According to the third method, a digital control device is employed in the printer. The digital control device is mainly comprised of both a crystal oscillator and a variable frequency divider. The crystal oscillator produces basic clock pulses having a very high frequency and stability. The variable frequency divider produces the print timing control pulses having a lower frequency than that of the basic clock pulses, however, the frequency of the print timing control pulses can be varied so as to keep the ratio between the scanning speed and the frequency of the basic clock pulses constant. The variation of the frequency of the printing control pulse can be defined by the dividing ratio of the variable frequency divider. The dividing ratio may be determined by a suitable memory device, such as a ROM (read only memory).

As is known, the character pattern is built up by many dots, that is a picture dot matrix, on the photoconductor drum. These dots are formed in each scanning line so that they are synchronous with the print timing control pulses in accordance with the character pattern signal. In a case where the character has a relatively simple pattern, such as an English letter or an Arabic numeral, each of these characters may be built up by a relatively small number of dots. Therefore, the print timing control pulses having a relatively low frequency may be used as the output from the print timing control pulse generator. However, in a case where the character has a relatively complicated pattern, such as a Chinese or Japanese Kanji character, each of these characters must be made up of a considerably large number of the dots. Therefore, the print timing control pulses having a considerably high frequency must be used as an output from the print timing control pulse generator. The print timing control pulses should be, for example, 40 MHz when the printing speed is set to be 10,000 lines/minute. In this case, according to the third method, the frequency of the basic clock pulse should be, for example, 320 (40×8) MHz, if the distortion of the character is to be limited to a width smaller than a ⅛ dot pitch. Thus, print timing control pulses having considerably high frequencies must be used in the printer so as to reproduce Chinese or Japanese Kanji characters without producing any distortion anywhere on each scanning line.

However, the above mentioned second method has a first defect in that it is very difficult to operate the function generator and the VCO with a high degree of accuracy on the order of $10^4$, without employing a high priced function generator and a high priced VCO. As a result, it is very difficult for the function generator and the VCO to correctly locate an n-th (n is a positive integer) dot of one scanning line at a position which aligns with the corresponding n-th dot of the preceding scanning line arranged adjacent to the scanning line without employing a high priced function generator and a high priced VCO. In addition, this method has a second defect in that it is necessary to perform maintenance adjustments of the function generator periodically. Finally, this method has a third defect in that, if the function of the function generator must be modified, another new function generator must be employed, instead of the old function generator.

The above mentioned third method has a first advantage in that it is very easy to correctly locate n-th dot of one scanning line at a position which aligns with the corresponding n-th dot of a preceding scanning line, merely by increasing the number of bits comprising the control data to be stored in the aforementioned ROM. This is because, since the frequency of the basic clock pulses is fixed, a highly stabilized oscillator, such as a crystal oscillator, can be used. A second advantage of this third method is that it is not necessary to carry out periodic maintenance, because the control data stored in the ROM cannot be changed by external conditions. A third advantage of this third method is that it is very easy to modify the function, merely by replacing the ROM with another ROM. However, this third method has a defect in that it is necessary to employ very high speed logic devices which can operate with the frequency of, for example, 320 MHz. However, from the technical and economical view points, it is preferable not to employ in the printer such very high speed logic devices.

The above mentioned first method has an advantage in that it is not necessary to use basic clock pulses having such a high frequency as 320 MHz (40×8). This is because the scanning light beam can always scan the photoconductor drum at a constant scanning speed due to the presence of the f−θ lens or parabolic reflector. However, this method has a defect in that the printer is high in cost and large in size. This is because a light control system including such a f−θ lens or parabolic reflector must be included in the printer.

SUMMARY OF THE INVENTION

Therefore, it is an object of the present invention to provide a timing pulse generator which can eliminate the above mentioned defects of the known non-impact printer when the timing pulse generator of the present invention is utilized in a non-impact printer.

It should be understood that the timing pulse generator according to the present invention can also be utilized in other technical fields.

BRIEF DESCRIPTION OF THE DRAWINGS

The present invention will be more apparent from the ensuing description with reference to the accompanying drawings wherein.

DESCRIPTION OF THE PREFERRED EMBODIMENTS

Figure 1:
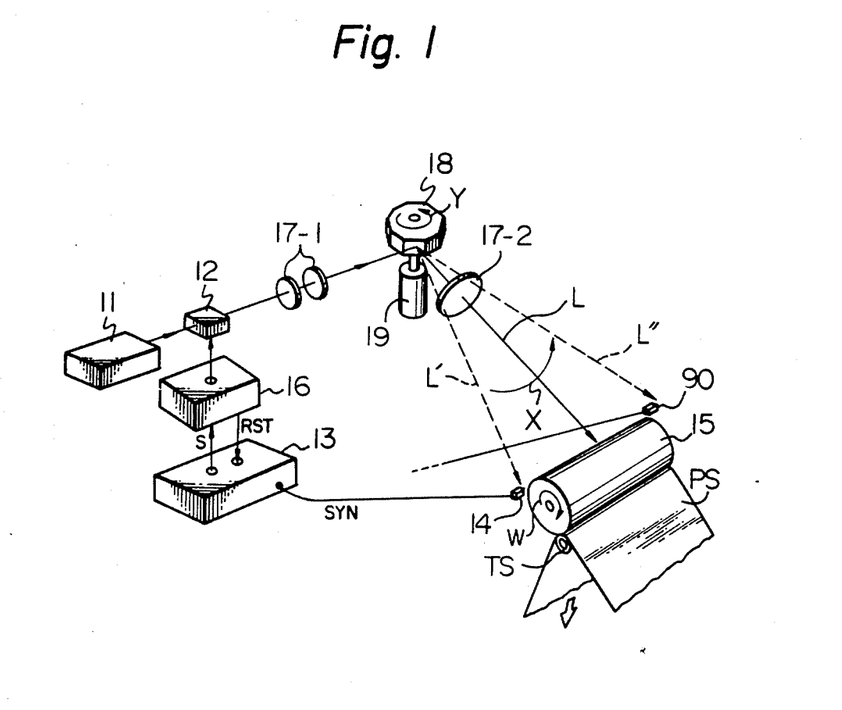
FIG. 1 is a schematically illustrated general view of a conventional non-impact printer system.

In FIG. 1, which is a schematically illustrated general view of a conventional non-impact printer system, the reference numeral 11 represents a light source, such as a gas laser or laser diode. The reference numeral 12 represents a light modulator. The light beam modulator 12 receives a light beam supplied from the light source 11 and produces a modulated light beam in accordance with both a character signal and print timing control pulses which are provided from a light modulation controller. The light modulation controller is comprised of a timing control pulse generator 13 and a character generator 16. The print timing control pulse generator 13 is operated by a print start pulse, which is called a synchronizing pulse (SYN), provided from a photodetector 14 which is permanently located close to one side of an area to be scanned on a photoconductor drum 15. The character signal is supplied from the character generator 16 under control of the generator 13. The modulated light beam from the modulator 12 passes through a first lens system 17-1 which focuses the modulated light beam to the desired diameter on a rotating polygonal mirror 18. The modulated light beam passed through the first lens system 17-1 is projected onto the rotating polygonal mirror 18 which is rotated by an electric motor 19, as indicated by the arrow Y. The modulated light beam reflected by the mirror 18 sequentially scans the area to be scanned on the photoconductor drum 15 as indicated by the arrow X, through a second lens system 17-2. The function of the second lens system 17-2 is to focus the reflected light beam to the desired diameter to form dotted images on the photoconductor drum 15. The drum 15 rotates in a direction indicated by the arrow W. A printing sheet PS is coupled with the drum 15 by means of a transfer station TS. The structural members which are necessary for carrying out the conventional electrophotographic process, such as a corotoron, a developer and a cleaner brush, are located around the drum 15, but such conventional members are not illustrated in FIG. 1.

In FIG. 1, the present invention is applied to the timing control pulse generator 13. The generator 13 receives the synchronizing pulse SYN from the photodetector 14. Then, the generator 13 supplies the timing control pulses S to the generator 16 synchronously with the synchronizing pulse SYN. The generator 13 is reset to its initial state by a reset pulse RST every time the generator 16 finishes providing the character signal for each scanning line.

Figure 2:
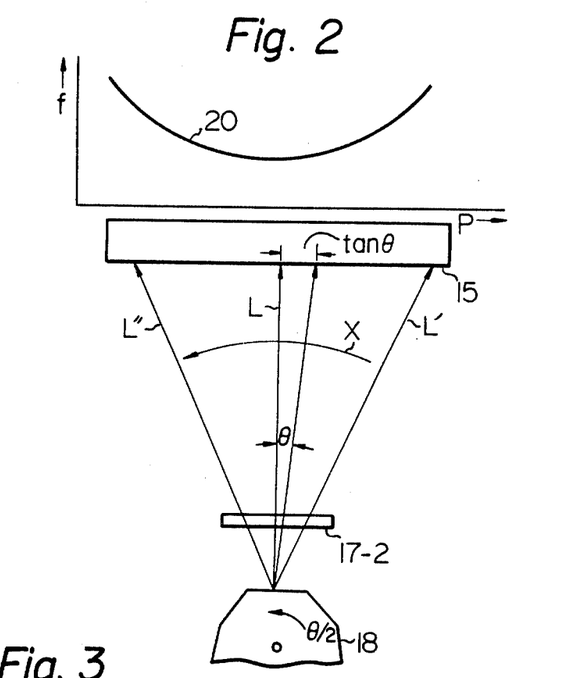
FIG. 2 is an explanatory view used for explaining the variable scanning speed of the scanning light beam L, L' and L" shown in FIG. 1.

As previously mentioned, the scanning light beam (see L, L', L" in FIG. 1) cannot scan the surface of the drum 15 at a constant scanning speed along each scanning line from one end to the other end. Accordingly, the timing control pulses must be variable frequency pulse signals having a relationship with a position, in each scanning line, onto which the scanning light beam is illuminated. The reason for this fact will be clarified with reference to FIG. 2. FIG. 2 is an explanatory view used for explaining the variable scanning speed of the scanning light beam L, L' and L" as illustrated in FIG. 1. In FIG. 2, the polygonal mirror 18, the second lens system 17-2 and the photoconductor drum 15 have already been explained with reference to FIG. 1. When the mirror 18 rotates with a rotating angle θ/2, the scanning light beam swings with a scanning angle $\theta$. In this case, the scanning speed of dots defined on the drum 15 by the scanning light beam is determined by $\sec^2\theta(1/\cos^2\theta)$. This is because, when the mirror 18 is rotated by an angle $\theta/2$ per unit of time, the dot runs on the drum 15 along the path having the length of $\tan\theta$ per unit of time. Consequently, the scanning speed of the scanning line, that is the speed of the production of the dots, is defined by $d/dt(\tan\theta)$ (t denotes the time), which is $\sec^2\theta \cdot d\theta/dt$ ($d\theta/dt$ is constant). Therefore, the middle area of the scanning line is scanned by the scanning light beam L at a relatively low scanning speed, while both side areas thereof are scanned by the scanning light beams L' and L'' at a relatively high scanning speed. Consequently, in order to obtain constant dot pitches along each entire scanning line, the frequency "f" of the timing control pulses must be varied in accordance with a curve 20. The curve 20 is defined by both an abscissa, which indicates a path of each scanning line, and an ordinate, which indicates the frequency f of the timing control pulses. It should be understood that the curve 20 varies in proportion to the characteristic of $\sec^2\theta$.

For the purpose of obtaining the characteristic of $\sec^2\theta$ with respect to the frequency of the timing control pulses, the above mentioned second and third typical methods have been proposed. However, these typical methods have the above mentioned respective defects.

The timing pulse generator according to the present invention will now be explained. The timing pulse generator according to the present invention is comprised of a first device for generating a plurality of reference pulse trains which have the same frequency as each other, but different phases from each other; a second device for storing control data which specifies a variable period of each two successive pulses of timing pulses to be generated, and; a third device for sequentially selecting one of the pulses among the pulses of the reference pulse trains in accordance with the control data every time one of the timing pulses is generated.

Figure 3:
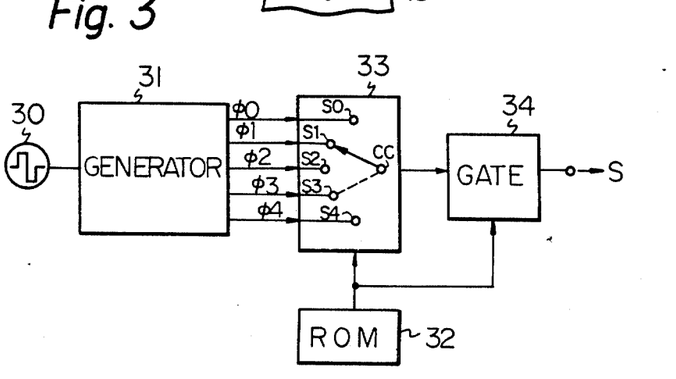
FIG. 3 illustrates a block diagram used for explaining the principle on which the present invention is based.

In FIG. 3, which illustrates a block diagram used for explaining the principle of the present invention, the reference symbol S represents the produced timing control pulses having a variable frequency (refer to "S" in FIG. 1). The reference numeral 31 represents the above mentioned first device for generating a plurality of reference pulse trains $\phi 0$ through $\phi 4$, based on basic clock pulses supplied from an oscillator 30. The reference pulse trains $\phi 0$ through $\phi 4$ have the same frequency as each other, but phases which are different from each other. The reference numeral 32 represents the above mentioned second device (ROM) for storing control data which specifies the variable period of each two successive pulses of the timing control pulses S to be produced. The reference numeral 33 represents the above mentioned third device for selecting one of the pulses among the reference pulse trains $\phi 0$ through $\phi 4$. The device 33 is schematically indicated by a mechanical rotary switch having five switch contacts S0 through S4 and a common contact CC. The control data provided from the ROM 32 specifies one of the switch contacts S0 through S4 to be connected to the common contact CC. The control data provided from the ROM 32 also controls a gate 34. The gate 34 is useful for extracting only a desired pulse from the pulses developed at the common contact CC.

Figure 4:
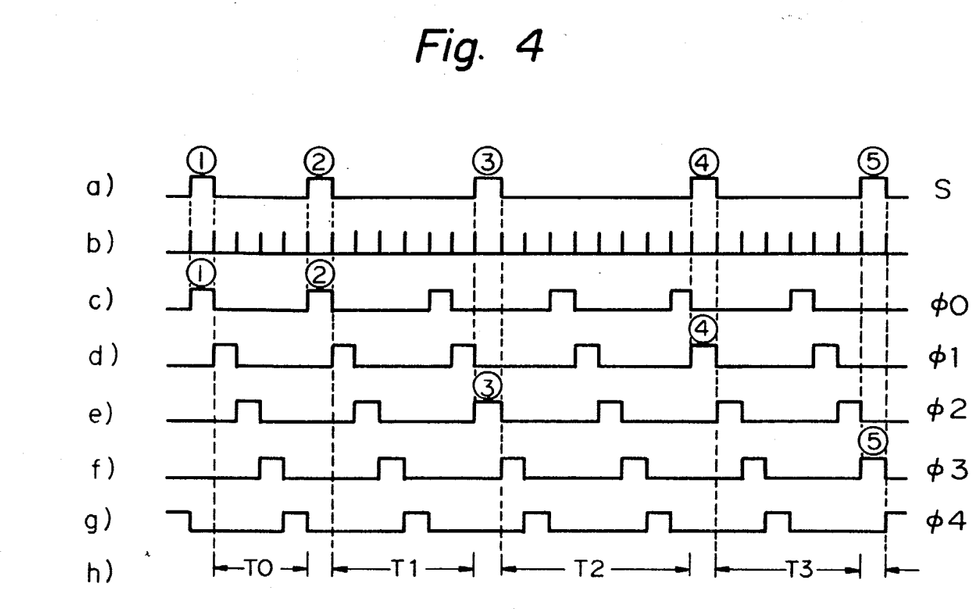
FIG. 4 depicts waveforms of signals appearing in the circuit illustrated in FIG. 3.

The operation of the circuit shown in FIG. 3 will now be further clarified with reference to both FIGS. 3 and 4. FIG. 4 depicts waveforms of signals appearing in the circuit of FIG. 3. The waveform of the timing control pulses S is indicated in a row (a) of FIG. 4. The waveforms of the reference pulse trains $\phi 0$ through $\phi 4$ are, respectively, indicated in rows (c) through (g). As seen from row (a), the produced timing control pulses S must have a variable frequency for the purpose of complying with the curve 20 of FIG. 2. Further, the reference pulse trains have the same frequency as each other, but phases which are different from each other. In row (a), the timing control pulse S is comprised of pulses ①, ②, ③, ④, ⑤ and so on. The variable period of each two successive pulses, such as ①-②, ②-③, ③-④ and so on, is previously determined according to the curve 20 of FIG. 2. The information of the variable period is contained in control data for generating the pulses S. The control data is previously stored in the ROM 32 (FIG. 3). The selecting device 33 (FIG. 3) sequentially specifies a desired one of the pulses under control of the ROM 32. Thus, the pulse ① of the pulses S is created by selecting the pulse ① from the reference pulse train $\phi 0$, the pulse ② of the pulses S is created by selecting the pulse ② from the reference pulse train $\phi 0$, the pulse ③ of the pulses S is created by selecting the pulse ③ from the reference pulse train $\phi 2$, the pulse ④ of the pulses S is created by selecting the pulse ④ from the reference pulse train $\phi 1$ and the pulse ⑤ of the pulses S is created by selecting the pulse ⑤ from the reference pulse train $\phi 3$. In this case, when the pulse ② of the pulses S is produced, the other pulses comprising the trains $\phi 1$ through $\phi 4$ should be masked. Accordingly, during a term T0 indicated in row (h), the gate 34 is closed. Similarly, during each of terms T1 through T3 shown in row (h), the gate 34 is also closed. In row (b) of FIG. 4, the waveform of the basic clock pulses is depicted. It should be noted that the basic clock pulses are not employed in the generator according to the present invention, but in the aforementioned third typical method. The frequency of the basic clock pulses of the prior art is very high, for example 320 MHz. Contrary to this, according to the present invention, such high frequency basic clock pulses are not necessary, but only a relatively low frequency reference pulse train, for example 40 MHz, is required. Thus, the oscillator 30 of FIG. 3 produces the reference pulse train (basic reference clock pulses), for example "$\phi 0$", which is a low frequency pulse train. The remaining reference pulse trains $\phi 1$ through $\phi 4$ can be produced merely by shifting the phase of the reference pulse train $\phi 0$.

Figure 5:
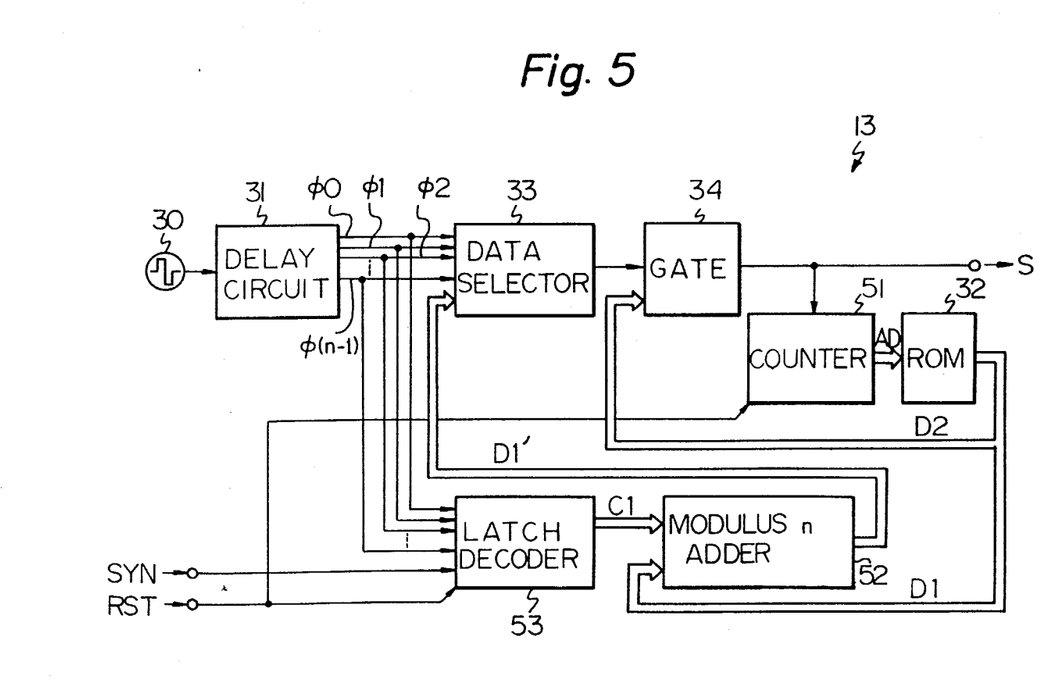
FIG. 5 is a block diagram of an embodiment according to the present invention.

In FIG. 5, which is a block diagram of a preferred embodiment according to the present invention, the members which have the same reference numerals or symbols as those indicated in FIG. 3 are identical to those in FIG. 3. The timing pulse generator, corresponding to the timing control pulse generator 13 illustrated in FIG. 1, includes the oscillator 30. The output from the oscillator 30 is applied to the first device 31, and the first means 31 produces the reference pulse trains $\phi 0, \phi 1, \phi 2 \ldots \phi(n-1)$ (n is positive integer). It is preferable that the first device 31 be made of delay circuits. For example, each of the delay circuits may be comprised of a shift register or a pair of capacitor elements and reactance element. The reference pulse trains have different phases from each other by $T/n$, where the symbol T denotes the period of the basic reference clock pulses produced from the oscillator 30 and the symbol n denotes the number of the reference pulse trains ($\phi 0$, $\phi 1$, $\phi 2 \ldots \phi n$). The reference pulse trains are simultaneously applied to the third device 33. It is preferable that the device 33 be made of a conventional data selector comprised of a combination of logic gates, although the device 33 is schematically indicated in FIG. 3, by the mechanical rotary switch. The data selector 33 selects a suitable one of the pulses from the reference pulse trains in the manner as mentioned before with reference to FIG. 4. The data selector 33 selects one of the pulses to be selected in accordance with a modified first control data D1' supplied from a modulus n adder 52. The modified first control data D1' is the sum of a first control data D1 from the ROM 32 and a first compensating data C1 supplied from a latch decoder 53. Thus, the modified first control data D1' may be represented by (D1+C1) modulus n. The first control data D1 is accessed, in the ROM 32, by an address data AD. The address data AD is supplied from a counter 51 which counts the number of pulses of the timing control pulses S. Accordingly, the address data AD varies incrementally or decrementally, such as AD1, AD2, AD3 . . . (not indicated in FIG. 5), every time the gate 34 provides the pulses ①, ②, ③ . . . (refer to row (a) in FIG. 4) sequentially. The counted number in the counter 51 is reset to zero every time the reset pulse RST (refer to "RST" in FIG. 1) is provided, when each of the scanning operations is finished. The ROM 32 stores both the first control data D1 and a second control data D2 with respect to each of the address data AD1, AD2, AD3 . . . . The first control data D1 acts to specify one of the reference pulse trains $\phi 0$, $\phi 1$, $\phi 2 \ldots \phi(n-1)$. The second control data D2 acts to specify the length of each term in which the gate 34 is to be closed (refer to terms T0, T1, T2 . . . indicated in FIG. 4). The first and second control data form a single control data block comprised of, for example, 8 bits. The upper 4 bits of the control data block corresponds to the second control data D2 and the lower 4 bits thereof corresponds to the first control data D1. The latch decoder 53 selects one of the reference pulse trains ($\phi 0$, $\phi 1$, $\phi 2 \ldots \phi(n-1)$). The selected reference pulse train is a pulse train which occurs first among the reference pulse trains when the synchronizing pulse SYN (refer to "SYN" indicated in FIG. 1) is applied to the latch decoder 53. Then, the latch decoder 53 decodes the signal of the selected reference pulse train. In short, the latch decoder 53 produces a number of the selected reference pulse trains ($\phi 0$, $\phi 1$, $\phi 2 \ldots \phi(n-1)$), for example 0, 1, 2 . . . n−1. The decoded number 0, 1, 2 . . . n−1 corresponds to said first compensating data C1 to be applied to the modulus n adder 52. The status of the latch decoder 53 is released by the reset pulse RST, every time the pulse RST is applied thereto when each scanning operation is finished.

Figure 6:
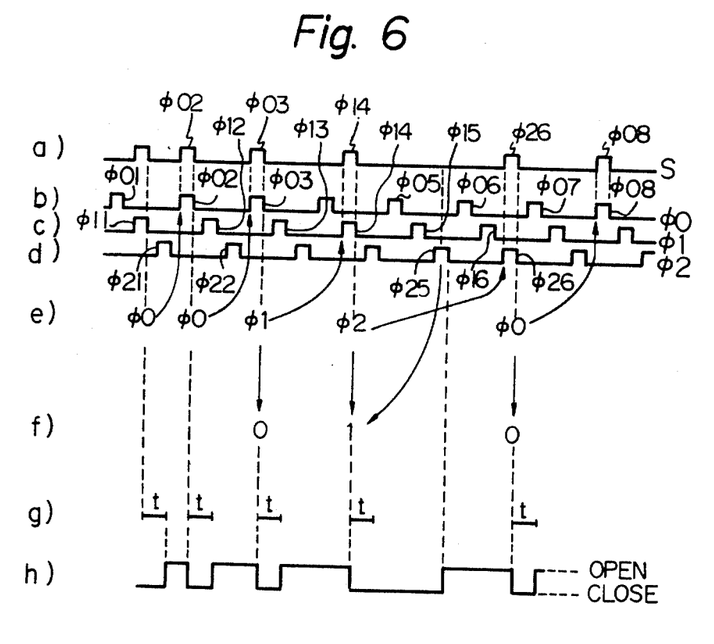
FIG. 6 depicts waveforms of signals appearing in the circuit 13 illustrated in FIG. 5.
Figure 7:
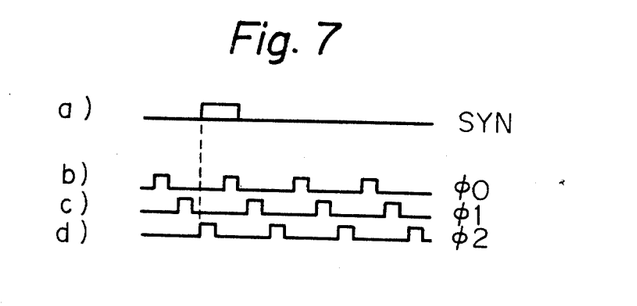
FIG. 7 depicts waveforms of signals used for explaining the compensating data C1 illustrated in FIG. 5.

The operation of the circuit 13 illustrated in FIG. 5 will now be further clarified by the following explanation with reference to FIGS. 6 and 7. Each of FIGS. 6 and 7 depicts waveforms of signals appearing in the circuit illustrated in FIG. 5. It should be recognized that, although n numbers of the reference pulse trains $\phi 0$, $\phi 1$, $\phi 2 \ldots \phi(n-1)$ are depicted, only three reference pulse trains $\phi 0$, $\phi 1$ and $\phi 2$ are depicted for the purpose of facilitating understanding of the present invention. Taking for example a case where the desired produced timing pulses have the waveform indicated in row (a) of FIG. 6, the data selector 33 (FIG. 3) suitably selects one of the reference pulse trains $\phi 0$, $\phi 0$, $\phi 1$, $\phi 2$, $\phi 0 \ldots$, sequentially, as indicated in row (e) of FIG. 6, every time the first control data D1 (FIG. 5) from the ROM 32 (FIG. 3) is updated. During the transient term till the time when the ROM 32 produces a final value of the data D1, the data D1 does not indicate the true value. If the data D1 is not the true value, the selecting operation in the data selector 33 (FIG. 5) cannot be achieved without error. Therefore, the gate 34 (FIG. 5) should always be closed during each of the transient terms. These terms are indicated by the symbol "t" in row (g) of FIG. 6. The length of each of these terms is constant. It should be noted that the term t is always included in each of the terms T0, T1, T2 . . . indicated in FIG. 4. During the term t, the gate 34 (FIG. 5) is closed (refer to row (h) of FIG. 6). The duration of the term in which the gate 34 is closed, is not only determined by the term t, but also another factor. The factor is as follows. Taking for example a case where the fifth pulse (refer to the symbol $\phi 26$ in row (a) of FIG. 6) is going to be produced, the data selector 33 quickly selects the reference pulse train $\phi 2$ when the fourth pulse ($\phi 14$) of the timing pulse S is produced. Therefore, any pulses other than the selected reference pulse train $\phi 2$, such as $\phi 05$, $\phi 15$, $\phi 06$, $\phi 16$, cannot be produced from the data selector. However, the pulse $\phi 25$ of the selected reference pulse train $\phi 2$ will be provided from the data selector 33, although the pulse $\phi 25$ is not a desired pulse for generating the timing pulse S. Accordingly, the gate 34 is also caused to be closed so as to stop the supply of the undesired pulse $\phi 25$ (the desired pulse is $\phi 26$). Thus, the gate 34 is closed not only during the term t, but also during the term between the occurrences of the pulses $\phi 14$ and $\phi 25$ (see row (h) of FIG. 6). It should be understood that the terms T0, T1, T2 . . . shown in row (h) of FIG. 4 are not exactly the same as the terms in which the gate 34 is closed. This is because the terms T0, T1, T2 . . . in FIG. 4 are depicted only for explaining the principle of the present invention. In row (f) of FIG. 6, the numerals 0, 1, 0 indicate the number of pulses to be omitted from the selected reference pulse train. Therefore, the number "1" in row (f) corresponds to the undesired pulse $\phi 25$. Thus, the first control data D1 stored in the ROM 32 indicates the number of the reference pulse train in accordance with the aforementioned curve 20 in FIG. 2, and the second control data D2 stored in the ROM 32, indicates the number of pulses to be omitted from the selected reference pulse train (see the numeral "1" in row (f) of FIG. 6).

As seen in FIG. 5, the basic reference clock pulses from the oscillator 30 are asynchronous with the synchronizing pulse SYN. Therefore, the reference pulse train to be selected first when the synchronizing pulse SYN has been applied to the latch decoder 53 (FIG. 5) is not always the initial reference pulse train $\phi 0$, as seen in FIG. 6. Referring to FIG. 7, the reference pulse train to be selected first when the synchronizing pulse SYN (see row (a)) is neither the pulse train $\phi 0$ nor the pulse train $\phi 1$ (see rows (b) and (c)), but the pulse train $\phi 2$ (see row (d)). Therefore, in FIG. 7, although the first control data D1 of the ROM 32 specifies the reference pulse train $\phi 0$, the control data to be applied to the data selector 33 must select the reference pulse train $\phi 2$. In this case, the latch decoder 53 (FIG. 5) produces the number "2" ($\phi 2$) as the compensating data C1. The number "2" is added (modulus 3), by the modulus 3 adder 52, to the number "0" ($\phi 0$) specified by the first control data D1. Consequently, even though the data D1 specifies the reference pulse train $\phi 0$, the modified first control data D1' does not specify the reference pulse train $\phi 0$, but the reference pulse train $\phi 2$, which train $\phi 2$ occurs first after the appearance of the pulse SYN (refer to FIG. 7).

Figure 8:
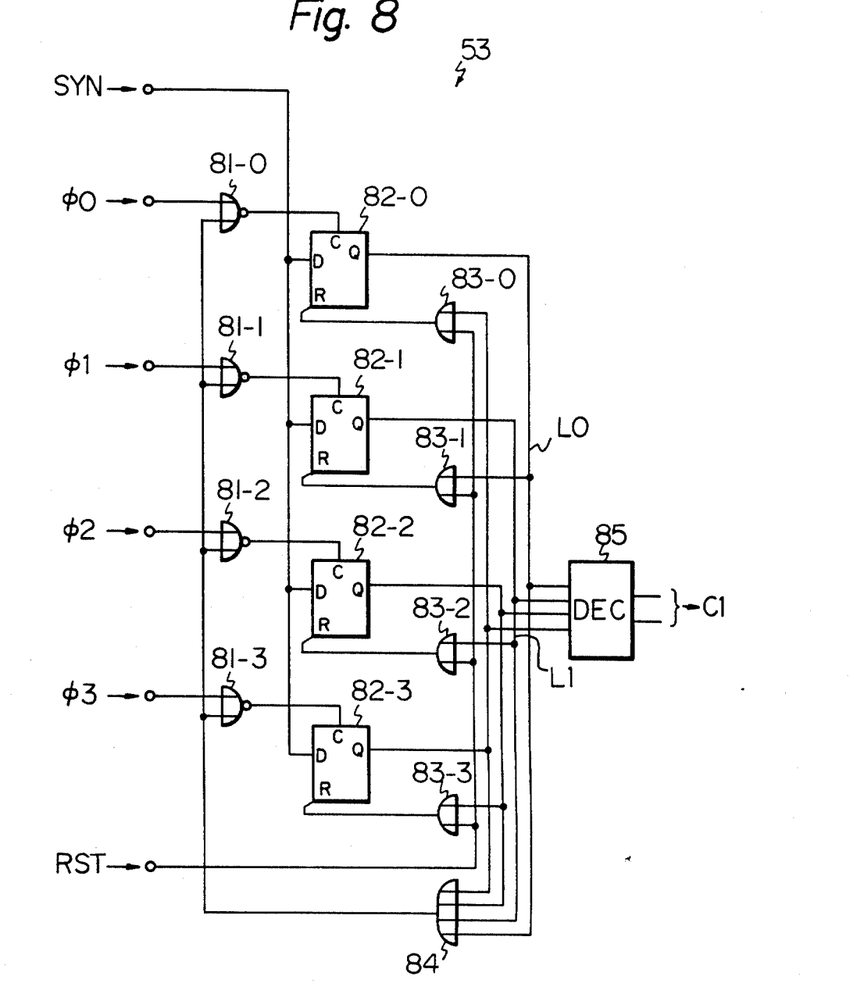
FIG. 8 is a circuit diagram of an example of the latch decoder 53 illustrated in FIG. 5.

In FIG. 5, the members 30, 31, 32, 33, 34, 51 and 52 are all made of conventional semiconductor devices. However, the latch decoder 53 is not a currently used semiconductor device. FIG. 8 is a circuit diagram of an example of the latch decoder 53. The latch decoder 53 illustrated in FIG. 8 is designed for a case where there are four reference pulse trains $\phi 0$ through $\phi 3$. The meanings of the members SYN, $\phi 0$ through $\phi 3$, RST and C1 have already been explained. The latch decoder 53 is comprised of four NOR gates 81-0 through 81-3, four D-flip-flops 82-0 through 82-3, four OR gates 83-0 through 83-3, an OR gate 84 and a decoder 85. The function of the latch decoder 53 is, as previously mentioned, to select a reference pulse train which occurs first after the appearance of the synchronizing pulse SYN, and then the decoder 53 holds the number, as the compensating data C1, of the selected reference pulse train during each scanning operation. When the preceding scanning is finished, the reset pulse RST is supplied to the latch decoder 53 and all the D-flip-flops 82-0 through 82-3 are reset by the reset pulse RST via respective OR gates 83-0 through 83-3. Thus, all the Q outputs of the D-flip-flops 82-0 through 82-3 become logic "0". Taking for example, a case where the reference pulse train $\phi 0$ occurs first when the synchronizing pulse SYN is produced, only the flip-flop 82-0 is set and other flip-flops 82-1 through 82-3 are not set. Then, the Q output of the the flip-flop 82-0 becomes logic "1". At this time, the Q outputs of the remaining flip-flops are still logic "0". Accordingly, input data of (1000) is applied to the decoder 85. Then, the decoder 85 produces the number "0" ($\phi 0$) as the compensating data C1. After this, if a first pulse of the reference pulse train $\phi 1$ is applied to the NOR gate 81-1, the input data of the decoder 85 will be changed from (1000) to (1100). However, the data C1, which is now the number "0", must not be changed until one scanning operation is finished. Accordingly, the input data (1000) must be maintained as it is during one scanning operation. In other words, the first pulse of the reference pulse train $\phi 1$ must be masked. The masking of this first pulse of the train $\phi 1$ is performed by resetting the flip-flop 82-1 immediately after the occurrence of the logic "1" from the Q output of the flip-flop 82-0. The reset of the flip-flop 82-1 is achieved by applying the Q output ("1") of the flip-flop 82-0 to the R (reset) terminal of the flip-flop 82-1, via a line L0 and the OR gate 83-1. Further, the first pulses of the reference pulse trains $\phi 2$ and $\phi 3$, which will follow thereafter, arechoked by applying the logic "1" on the line L0 to the NOR gates 81-2 and 81-3 (also 81-0 and 81-1), via the OR gate 84. At this time, all the NOR gates 81-0 through 81-3 are closed. If, for example, the reference pulse train $\phi 1$ occurs first, the Q output of the flip-flop 82-1 becomes logic "1" first. This logic "1" soon resets the next flip-flop 82-2, via a line L1 and, at the same time, closes all the NOR gates 81-0 through 81-3 via the OR gate 84. In this case, the input data of (0100) is being applied to the decoder 85 during one scanning operation, and the number "1" ($\phi 1$) is produced, as the data C1, from the decoder 85.

The ROM 32 in FIG. 5 stores the above mentioned first and second control data D1 and D2. These data D1 and D2 are previously obtained with the aid of a computer, based on the characteristic curve 20 in FIG. 2. Therefore, the first and second data D1 and D2 are ideal data derived from a mathematical calculation. However, in an actual printer system, many errors exist. Accordingly, it is preferable not to directly utilize the ideal data D1 (D1') and D2 for controlling the data selector 33 and the gate 34. The above mentioned errors are mainly produced by the rotating polygonal mirror 18 (FIG. 1). It should be understood that it is impossible to make the mirror 18 with mirror faces having exactly the same surface configuration with each other. Further, the surface configuration of each mirror face is changed due to the centrifugal force applied to each mirror face when the polygonal mirror 18 is rotating at a very high speed. As will be apparent from the above mentioned fact, the ideal first control data D1 must be modified by other compensating data.

Figure 9:
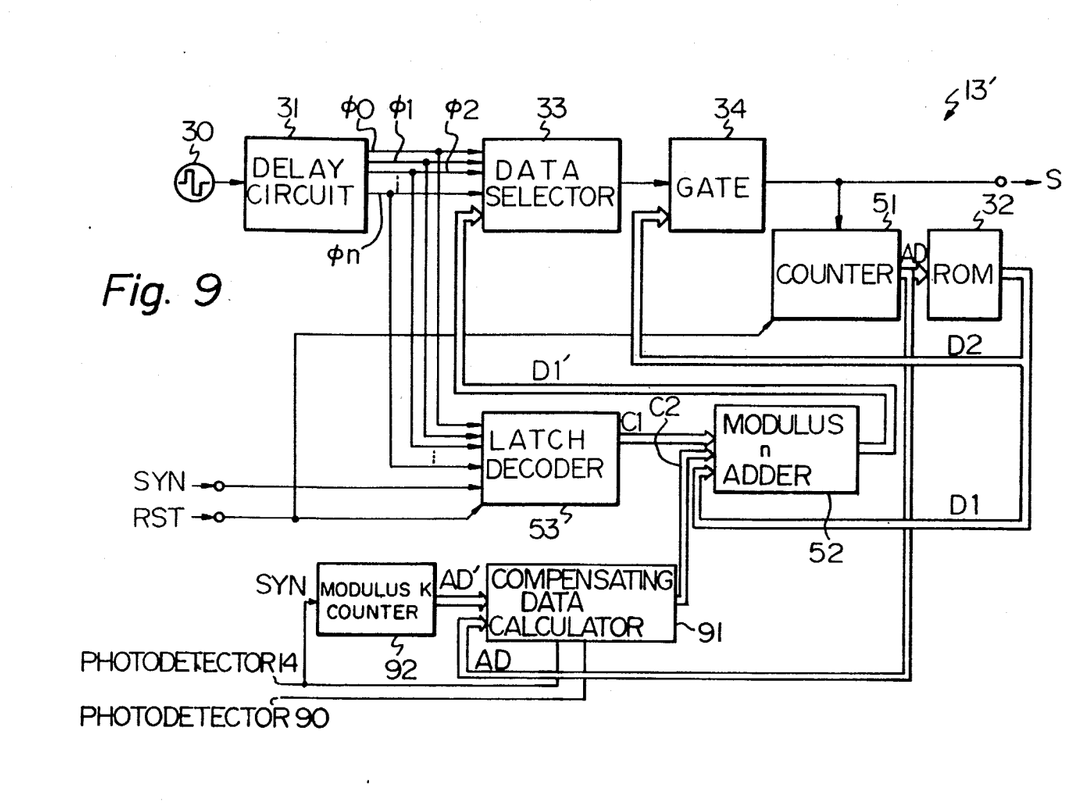
FIG. 9 is a block diagram of a modified embodiment according to the present invention.

FIG. 9 is a block diagram of a modified embodiment according to the present invention. The above mentioned compensating data is indicated as a second compensating data C2. The compensating data C2 is supplied from a compensating data calculator 91. The compensating data calculator 91 stores the compensating data C2 with respect to each of the mirror faces. The compensating data calculator 91 calculates the compensating data C2 by using address data AD and AD'. The address data AD' indicates the mirror face number. This is because the address data is an output of a modulus K counter 92 (K is the number of faces of the polygonal mirror). The counter 92 counts the number of mirror faces by counting the pulses SYN. Thus, the compensating data calculator 91 produces the second compensating data C2 with respect to the mirror face which is used for carrying out the corresponding scanning operation. The second compensating data C2 can be obtained through a mathematical calculation by the compensating data calculator 91, based on, for example, the scanning time for completing respective scanning operations. The scanning time may be detected by means of both the photodetector 14 (FIG. 1) and a photodetector 90 (FIG. 1). The scanning time is defined by the term from the occurrence of the output from the photodetector 14 to the occurrence of the output from the photodetector 90.

Figure 10:
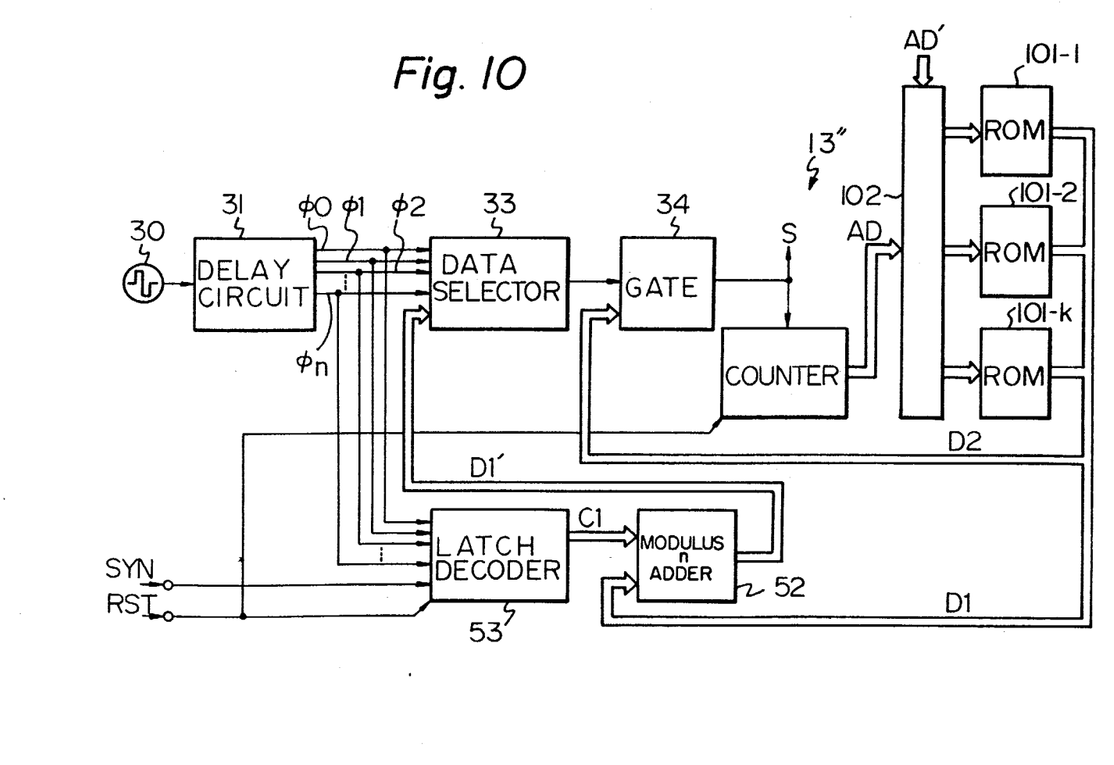
FIG. 10 is a block diagram of a further modified embodiment according to the present invention.

FIG. 10 is a block diagram of a further modified embodiment according to the present invention. In FIG. 10, a plurality of ROMs 101-1, 101-2 ... 101-k are employed in the circuit 13, instead of the ROM 32 illustrated in FIG. 5. The ROMs 101-1 through 101-k store the ideal first and second control data D1 and D2 of respective mirror faces. For example, when the first mirror face is operating, the scanning operation is conducted by using the data stored in corresponding ROM 101-1. The selection of the corresponding ROM may be achieved by address data AD'. This address data may also be produced from members similar to the member 92, illustrated in FIG. 9, via a demultiplexer 102.

A function similar to the function obtained by the second compensating data C2 may also be achieved by directly controlling the timing pulses S, without employing either the compensating data calculator 91 (FIG. 9) or the ROMs 101-1 through 101-k (FIG. 10). In this case, a phase shifter may be introduced after the gate 34 (FIG. 5). The amount of the phase to be shifted is specified by the output of the compensating data calculator which calculates the second compensating data C2.

Regarding the aforedescribed ROMs 32 and, 101-1 through 101-k, it is not necessary for each ROM to store the data with respect to all the dots produced on each scanning line. That is, it is enough for each ROM to store a half amount of the data with respect to all the dots. This is because as will be clear from FIG. 2, the dots in each scanning line are arranged symmetrically with respect to the center of the dots. In short, in FIG. 2, the data D1 and D2 used for producing the dots between the scanning light beams L' and L, are almost the same as the data D1 and D2 used for producing the dots between the scanning light beams L and L".

As explained in detail hereinbefore, the timing pulse generator can be comprised of low operating speed devices. Specifically, in FIG. 5, the members 30, 31, 32, 33, 34, 51, 52 and 53 are all created by low operating speed devices, such as 40 MHz at most. Further, the precision of the timing pulse S can be increased merely by increasing the number of delay circuit elements (see 31 in FIG. 5), without increasing the operating speed of each of the remaining devices.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

We claim:

1. A timing pulse generator for a light scanning apparatus having a character generator receiving timing pulses, a light modulator controlled by the character generator and a constant velocity rotating mirror and for producing timing pulses, the period of which is variable, said timing pulse generator comprising:
   first means for generating a plurality of reference pulse trains which have the same frequency as each other, but different phases from each other;
   second means for storing distortion control data which specify a variable period of each two successive pulses of the timing pulses to be produced and which compensates for scanning distortion produced by the rotating mirror;
   third means for sequentially selecting one of the pulses among the pulses of said reference pulse trains, in accordance with said distortion control data every time each of said timing pulses is produced; and
   gate means being introduced at the output of said third means, said gate means masking the pulses of the reference pulse trains other than the pulse to be selected, in accordance with the distortion control data to be stored in said second means, and the selected pulses forming the timing pulses received by the character generator, whereby the distortion produced by the rotating mirror is corrected.

2. A generator as set forth in claim 1, wherein said first means is comprised of an oscillator producing basic reference clock pulses and delay circuits connected thereto, the delay circuits producing the respective reference pulse trains, and
   wherein said third means comprises a data selector receiving the outputs from the delay circuits in parallel, and
   wherein said second means comprises a ROM (read only memory), the ROM stores the distortion control data comprising both first control data and second control data with respect to each of the timing pulses to be produced, the first control data controls the data selector and specifies one of the reference pulse trains to be selected, the second control data controls the logic gates and specifies the pulses be masked.

3. A generator as set forth in claim 2, wherein the generator is employed in the light scanning printer using a light beam, which printer includes the rotating mirror comprising a polygonal mirror having a plurality of mirror faces for scanning the light beam, and the ROM is independently divided into a plurality of ROMs, the ROMs are fixedly alloted to respective mirror faces, the ROMs contain compensating data for modifying the first control data, and the compensating data for correcting respective errors created by the mirror faces.

4. A generator as set forth in claim 2, wherein the generator is employed in the light scanning printer using a light beam, which printer includes the rotating mirror comprising a polygonal mirror having a plurality of mirror faces for scanning the light beam, and the generator further comprises a phase shifter at the output of the logic gates, the phase shifter shifts the phase of the timing pulse to be produced in accordance with compensating data indicating information for correcting respective errors created by mirror faces.

5. A generator as set forth in claim 2, wherein said delay circuits produce the reference pulse trains having different phase from each other by $T/n$, where the symbol $T$ denotes the period of the basic reference clock pulses produced from the oscillator and the symbol $n$ denotes the number of the reference pulse trains to be produced from the delay circuits.

6. A generator as set forth in claim 5, wherein each of the delay circuits is a shift register.

7. A generator as set forth in claim 2, further comprising addressing means incorporated with the ROM, which said addressing means specifies the pair of the first and second control data to be accessed.

8. A generator as set forth in claim 7, wherein said addressing means comprises a counter which counts the number of the timing pulses to be generated and produced from the logic gates.

9. A generator as set forth in claim 2, further comprising compensating means for further correcting the scanning distortion, wherein the first control data to be applied to the data selector is modified by said compensating means into first compensating data.

10. A generator as set forth in claim 9, wherein said compensating means is triggered by an external synchronizing pulse, and each set of the timing pulses to be produced is produced synchronously with this external synchronizing pulse.

11. A generator as set forth in claim 10, wherein said compensating means comprises:
    means for detecting a number of the reference pulse train which occurs first when the external synchronizing pulse occurs; and
    means for adding said number of the detected reference pulse train, as the first compensating data, with the first control data to be supplied from said ROM.

12. A generator as set forth in claim 11, wherein said means for adding comprises an adder receiving, at its input, the first control data and the first compensating data and produces, at its output, the modified first control data.

13. A generator as set forth in claim 12, wherein said adder further receives, at its input, at least a second compensating data.

14. A generator as set forth in claim 13, wherein the generator is employed in the light scanning printer using a light beam, which printer includes the rotating mirror comprising a polygonal mirror having a plurality of mirror faces for scanning the light beam, and the second compensating data indicates correcting information for respective errors created by the mirror faces.

15. A pulse generator for a light scanning printer having a character generator receiving timing pulses, a light modulator controlled by the character generator and a constant velocity rotating mirror, and for producing timing pulses having desired variable periods, said pulse generator comprising:

generating means for producing a plurality of referenced pulse trains which have the same frequency but different phases respectively from each other;

storing means for storing distortion control data which specifies the desired variable periods for the timing pulses and which compensates for scanning distortion produced by the rotating mirror;

selecting means for selecting sequentially one of said plurality of reference pulse trains containing a desired pulse therein; and gate means for masking all of the reference pulses other than the desired pulse thereby producing the timing pulses received by the character generator, whereby the scanning distortion produced by the rotating mirror is corrected.

16. A pulse generator as set forth in claim 15, wherein said generating means includes an oscillator and a plurality of delay circuits for producing the reference pulse trains having the same frequency but different phases respectively from each other.

17. A pulse generator as set forth in claim 15, wherein said storing means includes memory means for storing the distortion control data comprising both first and second control data for each of the timing pulses to be produced.

18. A pulse generator as set forth in claim 15, wherein said selecting means includes a data selector for receiving the respective reference pulse trains.

19. A pulse generator as set forth in claim 15, wherein said gate means includes a plurality of logic gates.

* * * * *

UNITED STATES PATENT AND TRADEMARK OFFICE
CERTIFICATE OF CORRECTION

PATENT NO. : 4,410,234

DATED : October 18, 1983

INVENTOR(S) : TOMOHISA MIKAMI ET AL

It is certified that error appears in the above-identified patent and that said Letters Patent is hereby corrected as shown below:

```
Front page, [73] "Fumitsu" should be --Fujitsu--;
                 "Kanagawa" should be --Kawasaki--.

Column 6, line 61,  "means" should be --device--;
             line 66,  "element" should be --elements--.

Column 9, line 55,  "arechoked" should be --are
choked--.
```

Signed and Sealed this

Twentieth Day of March 1984

[SEAL]

Attest:

GERALD J. MOSSINGHOFF

Attesting Officer

Commissioner of Patents and Trademarks